(12) United States Patent
Yokotani et al.

(10) Patent No.: US 6,211,669 B1
(45) Date of Patent: Apr. 3, 2001

(54) MAGNETIC DETECTOR WITH IMPROVED NOISE RESISTANCE CHARACTERISTICS

(75) Inventors: Masahiro Yokotani; Izuru Shinjo; Yasuyoshi Hatazawa; Naoki Hiraoka, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/175,414

(22) Filed: Oct. 20, 1998

(30) Foreign Application Priority Data

May 11, 1998 (JP) .................................................. 10-127822

(51) Int. Cl.$^7$ .......................... G01R 33/09; G01P 3/488; G01B 7/30; G01D 5/14
(52) U.S. Cl. ............... 324/207.21; 324/174; 324/207.12; 324/252
(58) Field of Search ................................... 324/173, 174, 324/207.12, 207.21, 207.25, 252

(56) References Cited

U.S. PATENT DOCUMENTS

| | | | |
|---|---|---|---|
| 4,506,217 | * 3/1985 | Rothley et al. ................... | 324/252 X |
| 4,712,064 | 12/1987 | Eckhardt et al. . | |
| 5,450,009 | * 9/1995 | Murakami ........................ | 324/207.21 |
| 5,656,936 | * 8/1997 | Ao et al. ........................... | 324/207.21 |
| 5,789,919 | * 8/1998 | Umemoto et al. ............... | 324/207.21 |
| 5,841,276 | * 11/1998 | Makino et al. .................. | 324/207.21 |

FOREIGN PATENT DOCUMENTS

| | | |
|---|---|---|
| 34 26 784 | 1/1986 | (DE) . |
| 195 80 095 | 2/1996 | (DE) . |
| 196 49 400 | 12/1997 | (DE) . |

OTHER PUBLICATIONS

"Magnetoresistance Effect of Artificial Lattice", Journal of the Applied Magnetism Society of Japan, vol. 15, No. 51991, pp. 813–820.

* cited by examiner

Primary Examiner—Gerard R. Strecker
(74) Attorney, Agent, or Firm—Sughrue, Mion, Zinn, Macpeak & Seas, PLLC

(57) ABSTRACT

Disclosed is a magnetic detector in which a GMR device is operated within the limited range of a magnetic field so as to optimize changes in resistance value of the GMR device and to improve noise resistance. The magnetic detector comprises a magnet (4) for generating a magnetic field, a rotary member (2) of magnetic material arranged with a predetermined gap left relative to the magnet and provided with projections capable of changing the magnetic field generated by the magnet, and a giant magnetoresistance device (3) of which resistance value is changed depending on the magnetic field changed by the rotary member of magnetic material. The giant magnetoresistance device is arranged in such a position with a predetermined gap relative to the magnetic field generating means that the giant magnetoresistance device is subject to a bias magnetic field applied with the intensity of magnetic field in a predetermined range, e.g., 100±150 [Oe], where the giant magnetoresistance device exhibits a high resistance change rate.

5 Claims, 8 Drawing Sheets

CHARACTERISTIC OF APPLIED MAGNETIC FIELD-RESISTANCE CHANGE RATE

MAGNET SIZE L – APPLIED MAGNETIC FIELD ANGLE θ

PLATE PROJECTION PITCH N—DEVICE PITCH PITCH P

——— PLATE PROJECTION WIDTH OF 1mm
——— PLATE PROJECTION WIDTH OF 2mm
——— PLATE PROJECTION WIDTH OF 3mm
——— PLATE PROJECTION WIDTH OF 4mm OR MORE

FIGURE 15(A)   PROJECTION ⌒
               RECESS ⌣

FIGURE 15(B)   OUTPUT OF
               DIFFERENTIAL
               AMPLIFICATION
               CIRCUIT

FIGURE 15(C)   OUTPUT OF
               WAVE FORM    "1"
               SHAPING      "0"
               CIRCUIT

MAGNETIC DETECTOR WITH IMPROVED NOISE RESISTANCE CHARACTERISTICS

BACKGROUND OF THE INVENTION

1. Field of the Invention

The present invention relates to a magnetic detector for detecting changes of an applied magnetic field, and more particularly to a magnetic detector suitable for detecting, e.g., rotation information of an internal combustion engine.

2. Description of the Related Art

Generally, a giant magnetoresistance device (referred to as a GMR device hereinafter) is a so-called artificial lattice film, i.e., a laminate manufactured by alternately forming a magnetic layer and a non-magnetic layer one above the other in thickness of several angstroms to several tens angstroms, as described in "Magnetoresistance Effect of Artificial Lattice", Journal of Applied Magnetism Society of Japan, Vol. 15, No. 51991, pp. 813–821. Such known artificial lattice films are represented by (Fe/Cr)n, (Permalloy/Cu/Co/Cu)n, and (Co/Cu)n. The GMR device exhibits a much greater MR effect (MR change rate) than a conventional magnetoresistance device (referred to as an MR device hereinafter). Also, the GMR device is a so-called in-plane magnetic sensitive device of which MR effect depends on only a relative angle between the directions of magnetization of the magnetic layers adjacent each other, and which produces the same changes in resistance value regardless of any angular difference in direction of an external magnetic field with respect to a current.

In this respect, there is known a technique for detecting changes of a magnetic field as follows. Magnetic sensitive surfaces are formed by GMR devices, and electrodes are provided at both ends of each magnetic sensitive surface to form a bridge circuit. A constant-voltage and constant-current power supply is connected between two opposing electrodes of the bridge circuit so that changes in resistance value of the GMR devices are converted into voltage changes, thereby detecting changes of the magnetic field acting on the GMR devices.

FIG. 12 is a view showing a construction of a conventional magnetic detector using a typical GMR device as mentioned above; FIG. 12A is a side view and FIG. 12B is a plan view.

The conventional magnetic detector comprises a rotary member of magnetic material (referred to as a plate hereinafter) 2 which has projections capable of changing a magnetic field and is rotated in synch with a rotary shaft 1, a GMR device 3 arranged with a predetermined gap relative to the plate 2, and a magnet 4 for applying a magnetic field to the GMR device 3. The GMR device 3 has magnetoresistance patterns 3a, 3b formed in its magnetic sensitive surface. Furthermore, the GMR device 3 is attached in place by a fixing member (not shown) of non-magnetic material with a predetermined gap relative to the magnet 4.

In the above construction, when the plate 2 rotates, the magnetic field applied to the GMR device 3 is changed and so does a resistance value of each magnetoresistance pattern 3a, 3b.

FIG. 13 is a block diagram of a circuit configuration of a conventional magnetic detector.

The conventional magnetic detector comprises a Wheatstone bridge circuit 11 using GMR devices which are arranged with a predetermined gap relative to a plate 2 and are subject to a magnetic field applied from a magnet 4, a differential amplification circuit 12 for amplifying an output of the Wheatstone bridge circuit 11, a comparison circuit 13 for comparing an output of the differential amplification circuit 12 with a reference value, and a waveform shaping circuit 14 for receiving an output of the comparison circuit 13 and outputting a signal having a level "0" or "1" to an output terminal 15.

FIG. 14 shows one specific example of the circuit configuration represented by the block diagram of FIG. 13.

The Wheatstone bridge circuit 11 includes GMR devices 10A, 10B, 10C and 10D which are each disposed, by way of example, in one side of a bridge. One ends of the GMR devices 10A and 10C are interconnected at a junction point 16 which is connected to a power source terminal Vcc, while one ends of the GMR devices 10B and 10D are interconnected at a junction point 17 which is grounded. The other ends of the GMR devices 10A and 10B are interconnected at a junction point 18, while the other ends of the GMR devices 10C and 10D are interconnected at a junction point 19.

The junction point 18 of the Wheatstone bridge circuit 11 is connected to an inverted input terminal of an amplifier 12a in the differential amplification circuit 12 through a resistor. The junction point 19 is connected to a non-inverted input terminal of the amplifier 12a through a resistor and also connected through a resistor to a voltage dividing circuit which constitutes a reference power supply.

Further, an output terminal of the amplifier 12a is connected to an inverted input terminal of the comparison circuit 13. A non-inverted input terminal of the comparison circuit 13 is connected to a voltage dividing circuit which constitutes a reference power supply, and also connected to an output terminal thereof through a resistor.

An output terminal of the comparison circuit 13 is connected to the power source terminal Vcc through a resistor, and a base of a transistor 14a in the waveform shaping circuit 14. A collector of the transistor 14a is connected to the output terminal 15 and also connected to the power source terminal Vcc through a resistor, whereas an emitter of the transistor 14a is grounded.

The operation of the above magnetic detector will be described below with reference to FIG. 15.

When the plate 2 rotates, the GMR devices 10A and 10D of the Wheatstone bridge circuit 11 are subject to the same changes of a magnetic field, and the GMR devices 10B and 10C thereof are subject to the changes of a magnetic field which are the same to each other, but different from the changes of a magnetic field applied to the GMR devices 10A and 10D, corresponding to projections and recesses of the plate 2 shown in FIG. 15A. As a result, resistance values of the pairs of GMR devices 10A, 10D; 10B, 10C are changed corresponding to the projections and recesses of the plate 2 such that the resistance values are maximized and minimized in reversed positional relation. Middle point voltages at the junctions 18, 19 of the Wheatstone bridge circuit 11 are also changed likewise.

Then, a difference between the middle point voltages is amplified by the differential amplification circuit 12 and, as shown in FIG. 15B, an output $V_{Do}$ indicated by a solid line is produced at the output terminal of the differential amplification circuit 12 corresponding to the projections and recesses of the plate 2 shown in FIG. 15A.

The output of the differential amplification circuit 12 is supplied to the comparison circuit 13 and compared with a comparison level, i.e., a reference value $V_{TH}$. A comparison signal is shaped in waveform by the waveform shaping circuit 14. Consequently, an output having a level "0" or "1", indicated by a solid line in FIG. 15C, is obtained at the output terminal 15.

In the conventional magnetic detector, however, a merit of the GMR device, i.e., large resistance change, is not developed and a large gain cannot be achieved because the size of the magnet for applying a magnetic field to the GMR device, the projection width and pitch of the rotary member of magnetic material for changing the magnetic field applied to the GMR device, as well as the magnetoresistance pattern size and pitch of the GMR device are not sufficiently optimized. Accordingly, there has been a problem that the conventional magnetic detector is easily affected by noise and has lower noise resistance.

SUMMARY OF THE INVENTION

With a view of solving the problems set forth above, an object of the present invention is to provide a magnetic detector in which changes in resistance value of a GMR device is maximally utilized depending on a projection shape of a rotary member of magnetic material under detection, and noise resistance is improved.

A magnetic detector according to a first aspect of the present invention comprises magnetic field generating means for generating a magnetic field, a rotary member of magnetic material arranged with a predetermined gap relative to the magnetic field generating means, and provided with projections capable of changing the magnetic field generated by the magnetic field generating means, and a giant magnetoresistance device of which resistance value is changed depending on the magnetic field changed by the rotary member of magnetic material, the giant magnetoresistance device being arranged in such a position with a predetermined gap relative to the magnetic field generating means that the giant magnetoresistance device is subject to a bias magnetic field applied with the intensity of magnetic field in a predetermined range where the giant magnetoresistance device exhibits a high resistance change rate.

According to a second aspect of the present invention, in the above magnetic detector of the first aspect, magnetoresistance patterns of the giant magnetoresistance device are arranged so as to satisfy $\theta = \{(L/2)+4\} \pm 2[°]$ on an assumption that the length of the rotary member of magnetic material in the rotating direction of the magnetic field generating means is L and the vector direction of a bias magnetic field applied to the giant magnetoresistance device is $\theta$ (the direction of a vector vertical to a magnetoresistance surface of the giant magnetoresistance device being 0°).

According to a third aspect of the present invention, in the above magnetic detector of the first aspect, magnetoresistance patterns of the giant magnetoresistance device are arranged so as to satisfy $P = \{L \times (0.25 \times M + 0.4)/7\} \pm 0.3[mm]$ on an assumption that the pitch between the magnetoresistance patterns of the giant magnetoresistance device, constituting a bridge circuit, is P, the length of the rotary member of magnetic material in the rotating direction of the magnetic field generating means for applying a bias magnetic field to the giant magnetoresistance device is L, and the projection width of the rotary member of magnetic material is M.

According to a fourth aspect of the present invention, in the above magnetic detector of the first aspect, magnetoresistance patterns of the giant magnetoresistance device are arranged so as to satisfy $P = [(N-3)/4 \times \{(0.3 \times M + 0.3) \times L/7 - 0.6\} + 0.6] \pm 0.3[mm]$ on an assumption that the pitch between the magnetoresistance patterns of the giant magnetoresistance device, constituting a bridge circuit, is P, the length of the rotary member of magnetic material in the rotating direction of the magnetic field generating means for applying a bias magnetic field to the giant magnetoresistance device is L, and the projection width and the projection pitch of the rotary member of magnetic material are M and N, respectively.

According to a fifth aspect of the present invention, in the above magnetic detector of any of the first to fourth aspects, the predetermined range of the intensity of magnetic field is 100±150 [Oe].

BRIEF DESCRIPTION OF THE DRAWINGS

FIG. 15 shows waveform charts (A–C) for explaining the operation of the circuit shown in FIG. 14.

DESCRIPTION OF THE PREFERRED EMBODIMENTS

Preferred embodiments of a magnetic detector according to the present invention will be described below with reference to the drawings.

Embodiment 1

A construction, circuit block diagram, specific circuit configuration, and operation of a magnetic detector according to Embodiment 1 of the present invention are the same as those of the conventional magnetic detector, except for the later-described arrangement of a magnetoresistance pattern of a GMR device relative to a magnet, and the description thereof is omitted here in detail.

In this Embodiment 1, a magnetoresistance pattern formed in a magnetic sensitive surface of a GMR device is arranged relative to a magnet so that the intensity of a bias magnetic field applied to the GMR device, i.e., the intensity of a magnetic field changed by a plate which serves as a rotary member of magnetic material, varies in amplitude range of 100±50 [Oe].

Figure 1:
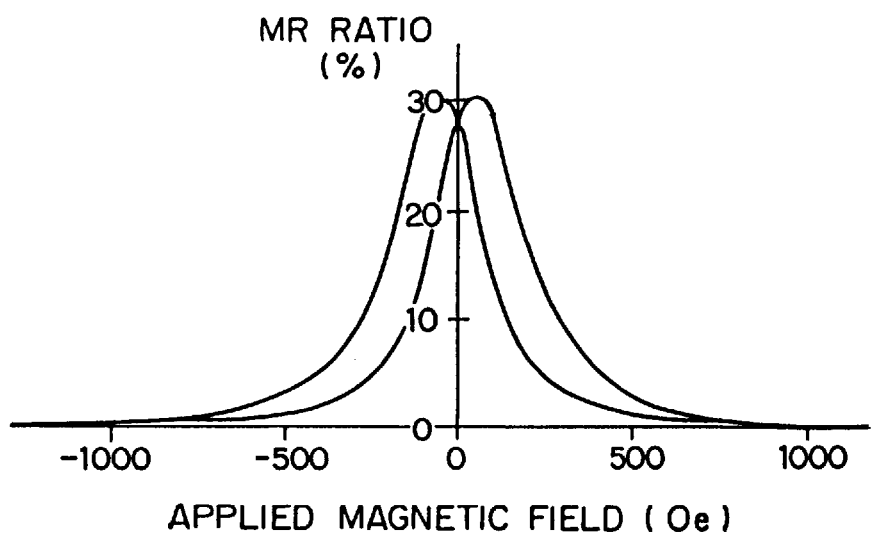
FIG. 1 is a graph showing an MR characteristic of a GMR device used in a magnetic detector according to the present invention resulted when a magnetic field of ±1000 [Oe] is applied.

A graph of FIG. 1 shows a resistance change rate (referred to as an MR ratio hereinafter) of a GMR device resulted when a magnetic field of 0~1000 [Oe] is applied. As seen from the graph of FIG. 1, the GMR device has a hysteresis characteristic. Here, the MR ratio is expressed by:

$$MR\ \text{ratio} = \{(Rmax - Rmin)/Rmin\} \times 100 [\%]$$

where Rmax is a maximum resistance value and Rmin is a minimum resistance value.

Figure 2:
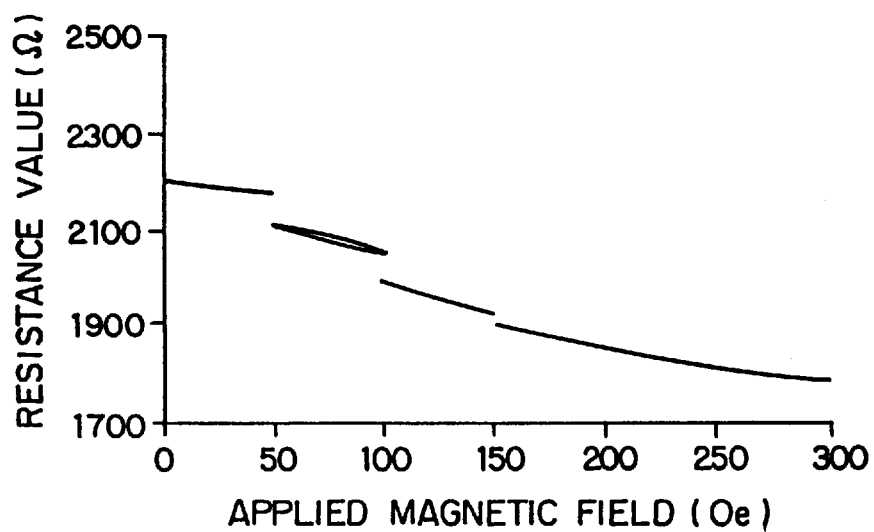
FIG. 2 is a graph showing a temperature characteristic of changes in resistance value of the GMR device used in the magnetic detector according to the present invention resulted when a magnetic field of 0~300 [Oe] is applied in steps of 50 [Oe].

A graph of FIG. 2 shows a temperature characteristic of changes in resistance value of the GMR device resulted when a magnetic field is applied in steps of 50 [Oe], i.e., 0~50, 50~100, 100~150, 150~200, 200~250 and 250~300 [Oe], in consideration of that the applied magnetic field is changed corresponding to projections and recesses of the rotary member of magnetic material.

Figure 3:
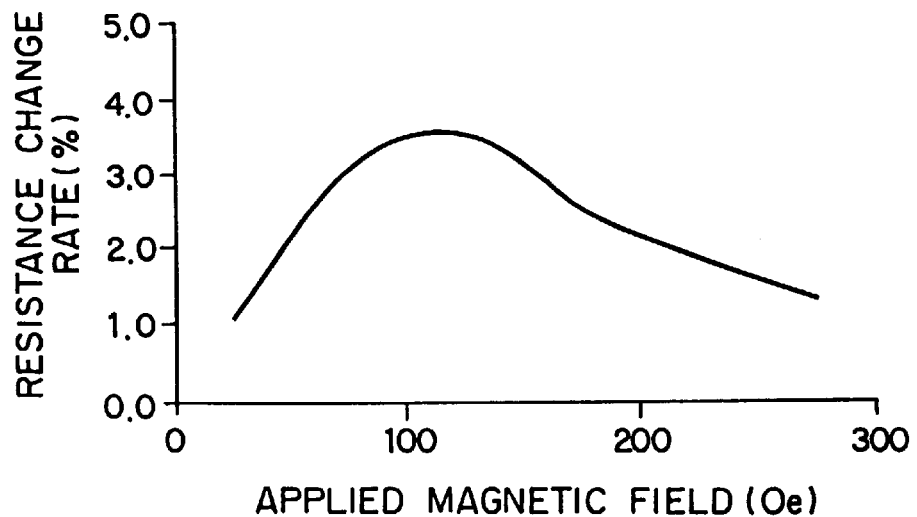
FIG. 3 is a graph showing a temperature characteristic of MR ratio of a GMR device in Embodiment 1 of the magnetic detector according to the present invention resulted when a magnetic field of 0~300 [Oe] is applied in steps of 50 [Oe].

A graph of FIG. 3 shows a characteristic of resistance change rate of the GMR device resulted when a magnetic field is applied in steps of 50 [Oe] as mentioned above.

As seen from the graph of FIG. 3, the range of a magnetic field applied to the GMR device, where a maximum MR ratio is obtained, is 50~150 [Oe]; that is to say, a maximum MR ratio is achieved by setting, to 100 [Oe], the center of a bias magnetic field which is generated by the magnet and applied to the GMR device while being changed corresponding to the projections and recesses of the rotary member of magnetic material.

In this embodiment, therefore, the GMR device is arranged in such a position with a predetermined gap left relative to the magnet that a bias magnetic field of 100±50 [Oe] is applied to the GMR device. As a result, changes in resistance value of the GMR device is maximally utilized and noise resistance is improved.

Thus, according to this embodiment, by arranging the GMR device in such a position with a predetermined gap relative to the magnet that a bias magnetic field of 100±50 [Oe] is applied to the GMR device, it is possible to maximally utilize changes in resistance value of the GMR device and to improve noise resistance.

Embodiment 2.

Figure 4A:
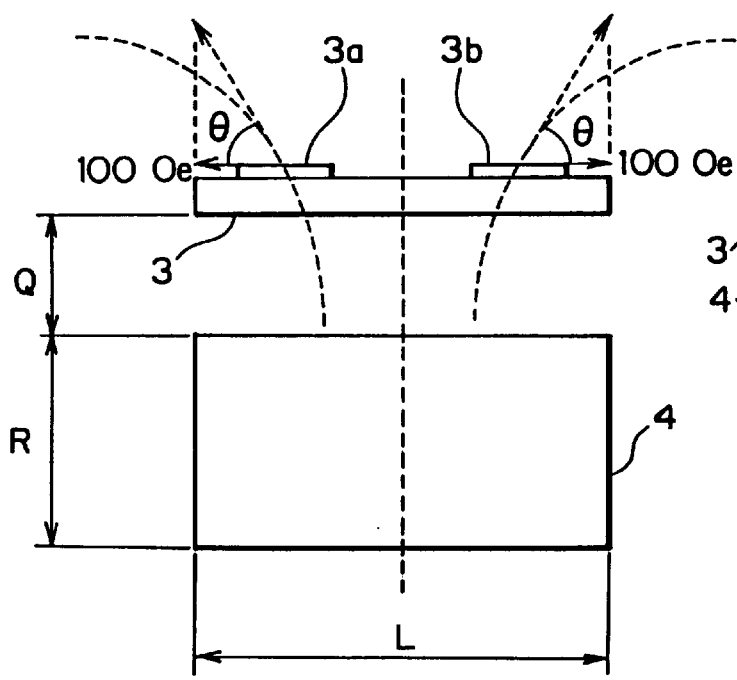
FIGS. 4A and 4B are a representation showing layout in principal part of Embodiment 2 of the magnetic detector according to the present invention.
Figure 4B:
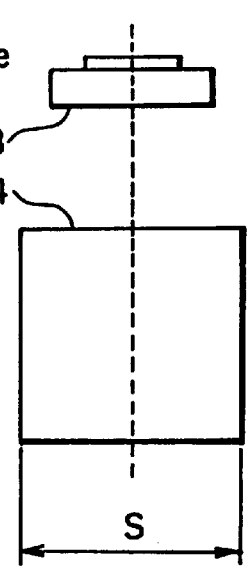

FIGS. 4A and 4B are a representation showing layout in principal part of Embodiment 2 of the magnetic detector according to the present invention. In FIGS. 4A and 4B, L indicates the size, i.e. length, of the magnet 4 in the rotating direction of the plate, R indicates the thickness of the magnet 4 in the direction opposed to the plate, S indicates the width of the magnet 4 in the direction of vertical axis of the plate, and Q indicates the distance between the magnet 4 and the GMR device 3.

Figure 5:
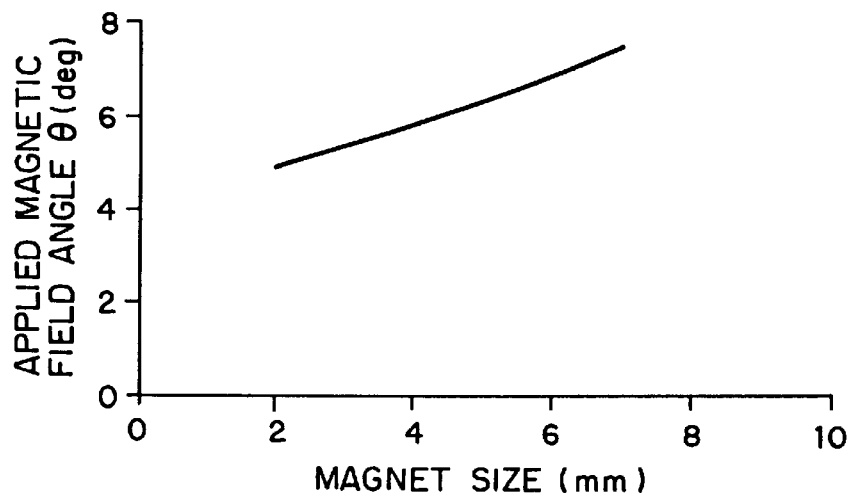
FIG. 5 is a graph showing the relationship between a magnet size and a vector direction of an applied magnetic field in Embodiment 2 of the magnetic detector according to the present invention.

In above Embodiment 1, a bias magnetic field applied to a GMR device is set to the range of 100±150 [Oe]. By contrast, this Embodiment 2 is designed in consideration of that an arrangement capable of providing a maximum MR ratio in a position where a bias magnetic field of 100 [Oe] is applied to magnetoresistance patterns 3a, 3b of the GMR device 3, as shown in FIGS. 4A and 4B, is correlated to the length (magnet size) L of the magnet 4 in the rotating direction of the plate and the vector direction (angle of the applied magnetic field) θ of the bias magnetic field applied to the GMR device (assuming that the direction of a vector vertical to the magnetoresistance surface of the GMR device is 0°). A graph of FIG. 5 shows the correlation between L in millimeters and θ.

The correlation between L and θ is expressed by the following formula:

$$\theta = \{(L/2) + 4\} \pm 2\ [°0] \qquad (1)$$

Accordingly, the magnetoresistance patterns 3a, 3b of the GMR device 3 are arranged with respect to the magnet 4 so as to satisfy the above formula (1) in the correlation between the length of the magnet 4 in the rotating direction of the plate and the vector direction of the bias magnetic field applied to the GMR device 3. As a result, changes in resistance value of the GMR device 3 is maximally utilized and noise resistance is improved.

Note that the other dimensions R and S of the magnet 4 than the length L in the rotating direction of the plate can be optionally set depending on the distance between the magnet 4 and the GMR device 3.

Thus, according to this embodiment, by arranging the magnetoresistance patterns of the GMR device with respect to the magnet so as to satisfy the above formula (1) in the correlation between the length of the magnet in the rotating direction of the plate and the vector direction of the bias magnetic field applied to the GMR device, it is possible to maximally utilize changes in resistance value of the GMR device and to improve noise resistance.

Embodiment 3.

Figure 6:
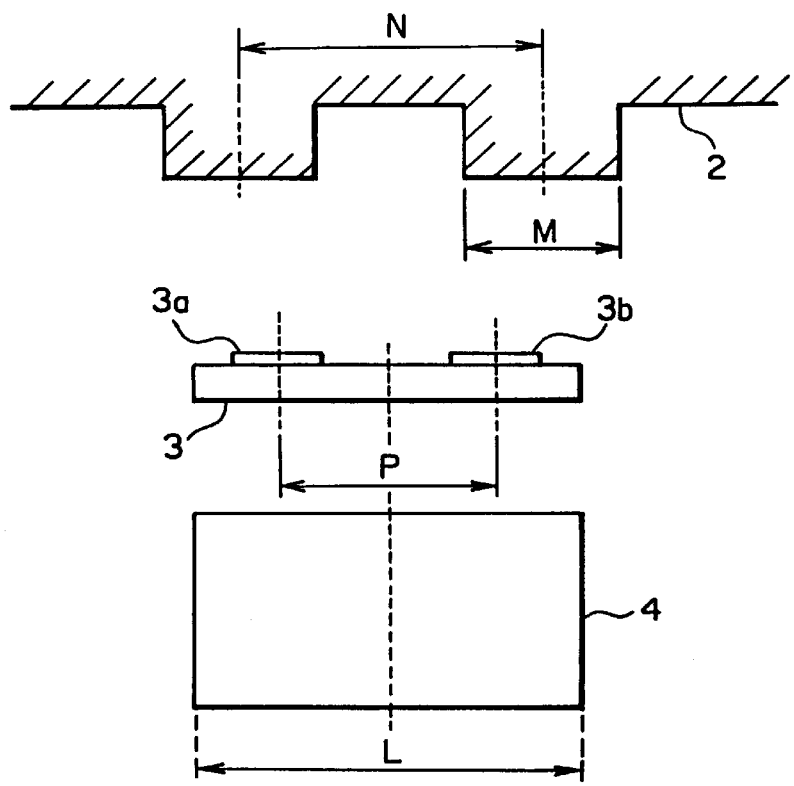
FIG. 6 is a representation showing layout in principal part of Embodiment 3 of the magnetic detector according to the present invention.

FIG. 6 is a representation showing layout in principal part of Embodiment 3 of the magnetic detector according to the present invention. In FIG. 6, L indicates the length of the magnet 4 in the rotating direction of a plate 2, M indicates the projection width of the plate 2, N indicates the projection pitch of the plate 2, and P indicates the pitch between the magnetoresistance patterns 3a, 3b of the GMR device 3.

In above Embodiment 2, changes in resistance value of the GMR device cannot be maximally utilized in some cases depending on a projection shape of the plate which changes the magnetic field generated by the magnet. In this Embodiment 3, therefore, magnetoresistance patterns of a GMR device are optimally arranged, taking into account the projection shape of the plate.

First, measurement was performed on such a case that the pitch P between the magnetoresistance patterns 3a, 3b of the GMR device 3 was set to an imaginary optimum value on condition that the projection width M and the projection pitch N of the plate 2 were set so sufficiently large as to make effects of these parameters negligible. A graph of FIG. 7 shows the relationship between the length (magnet size) L of the magnet 4 in the rotating direction of the plate and a resistance change rate ΔR of the GMR device in that case.

Figure 7:
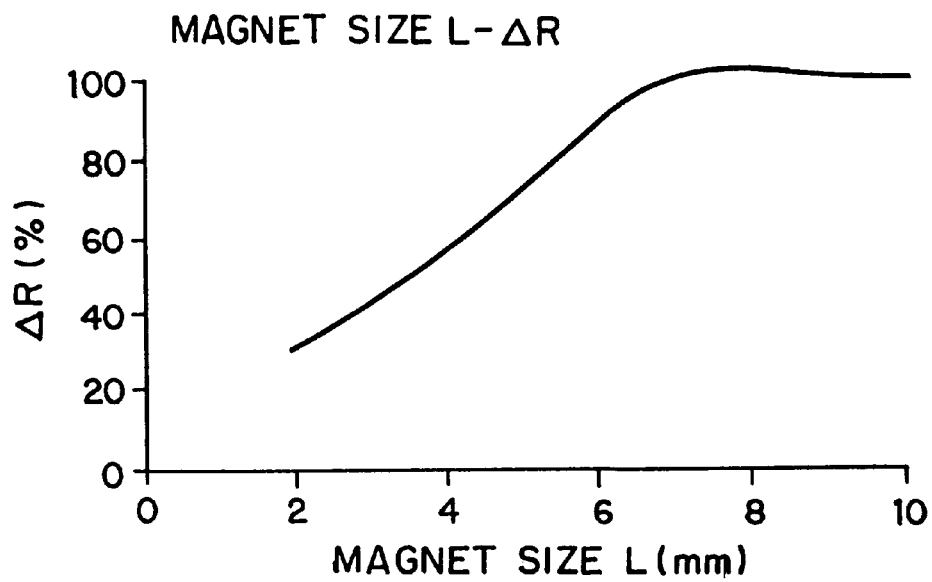
FIG. 7 is a graph showing the relationship between the magnet size and a resistance change rate $\Delta R$ of the GMR device in Embodiment 3 of the magnetic detector according to the present invention.

As seen from the graph of FIG. 7, resistance changes of the GMR device are saturated at L>7 mm.

Next, measurement was performed on such a case that the pitch P between the magnetoresistance patterns 3a, 3b of the GMR device 3 was set to the imaginary optimum value on condition that the length L of the magnet 4 in the rotating direction of the plate 2 was set to be L>7 and the projection pitch N of the plate 2 was set sufficiently large. A graph of FIG. 8 shows the relationship between the projection width M of the plate 2 and the resistance change rate ΔR of the GMR device in that case.

Figure 8:
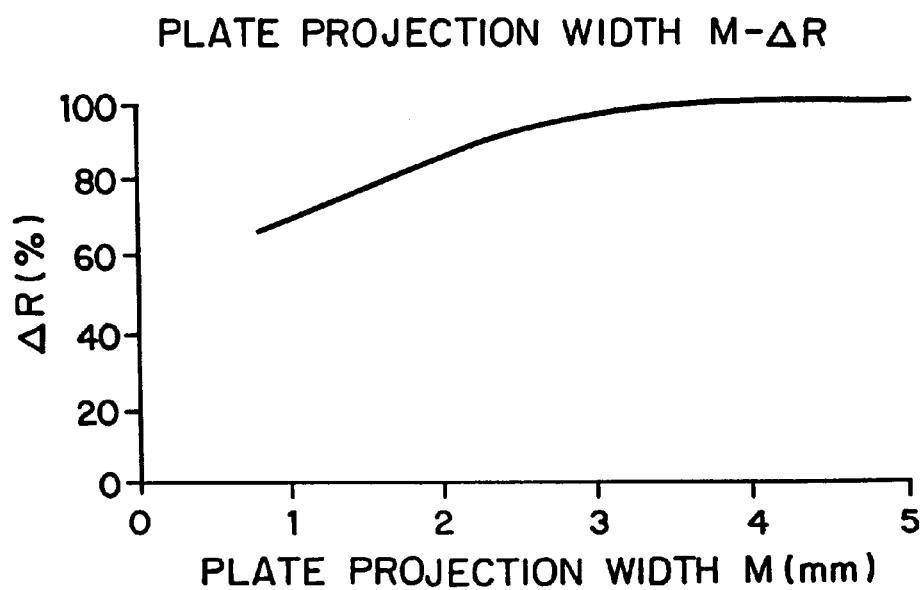
FIG. 8 is a graph showing the relationship between a plate projection width and the resistance change rate $\Delta R$ of the GMR device in Embodiment 3 of the magnetic detector according to the present invention.

As seen from the graph of FIG. 8, resistance changes of the GMR device are saturated at M>4 mm.

Further, measurement was performed on such a case that the pitch P between the magnetoresistance patterns 3a, 3b of the GMR device 3 was set to the imaginary optimum value on condition that the length L of the magnet 4 in the rotating direction of the plate 2 was set to be L>7 and the projection width M of the plate 2 was set sufficiently large. A graph of FIG. 9 shows the relationship between the projection pitch N of the plate 2 and the resistance change rate ΔR of the GMR device in that case.

Figure 9:
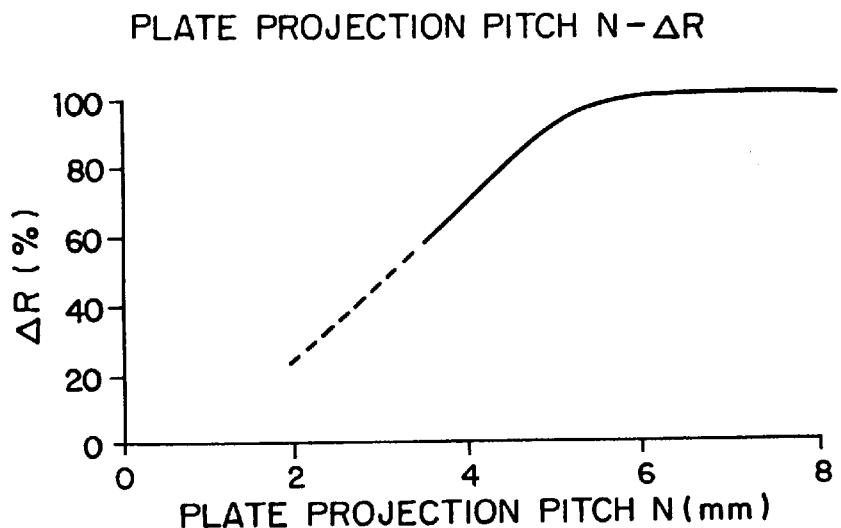
FIG. 9 is a graph showing the relationship between a plate projection pitch and the resistance change rate $\Delta R$ of the GMR device in Embodiment 3 of the magnetic detector according to the present invention.

As seen from the graph of FIG. 9, resistance changes of the GMR device are saturated at N>6 mm.

Figure 10:
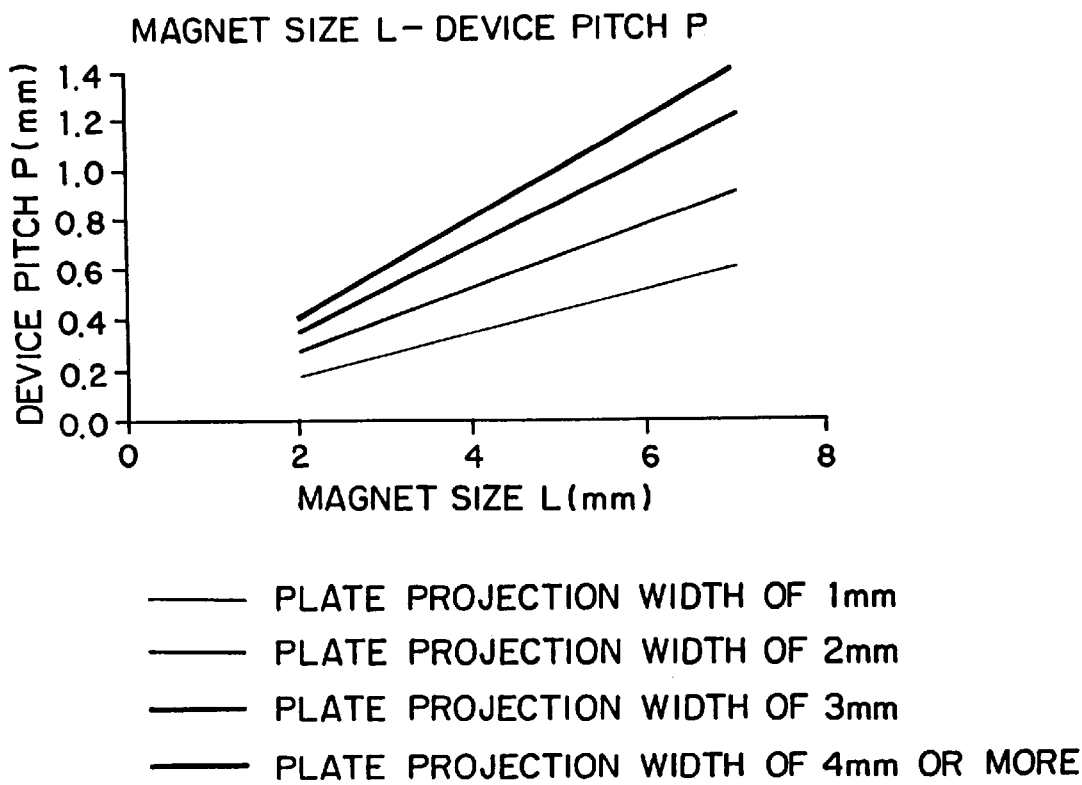
FIG. 10 is a graph showing the relationship among the magnet size, a magnetoresistance pattern pitch of the GMR device (device pitch) and the plate projection width in Embodiment 3 of the magnetic detector according to the present invention.

A graph of FIG. 10 shows the relationship among the length L of the magnet 4 in the rotating direction of the plate 2, the pitch (device pitch) P between the magnetoresistance patterns 3a, 3b of the GMR device 3 and the projection width M of the plate 2.

From the graph of FIG. 10, the following formula holds:

$$P = \{L \times (0.25 \times M + 0.4)/7\} \pm 0.3 \, [\text{mm}] \quad (2)$$

In the case of L>7, L=7 is put in the above formula (2) because ΔR is saturated as shown in the graph of FIG. 7. Likewise, in the case of M>4, M=4 is put in the above formula (2) because ΔR is saturated as shown in the graph of FIG. 8.

Figure 11:
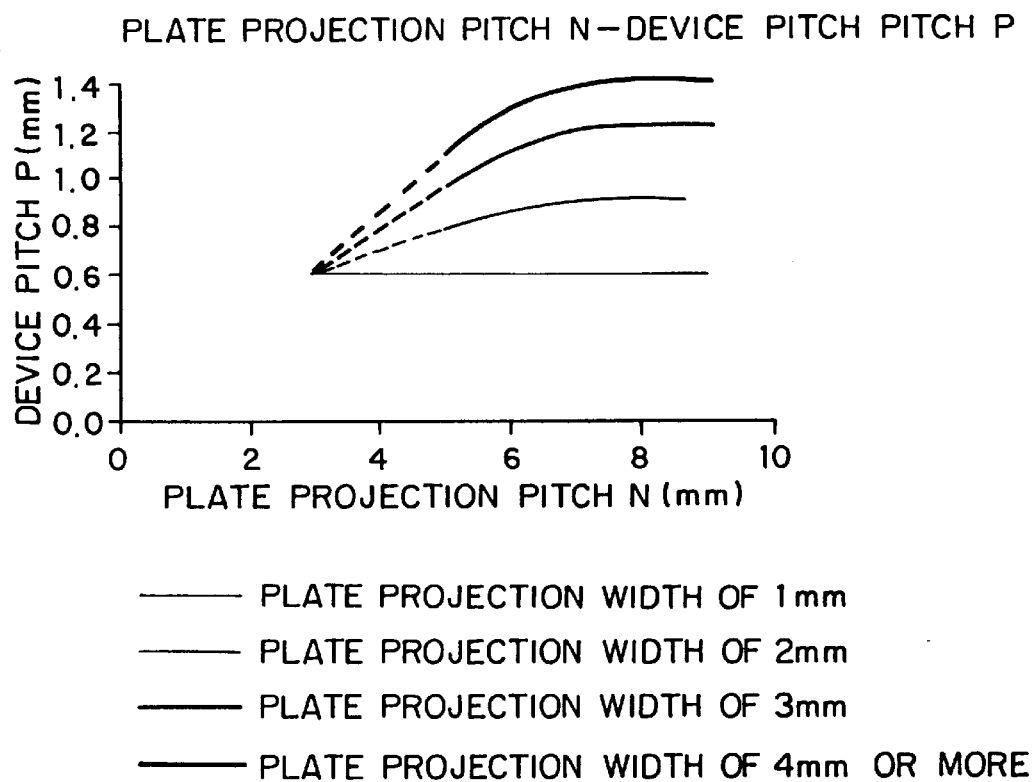
FIG. 11 is a graph showing the relationship among the magnetoresistance pattern pitch of the GMR device (device pitch), the plate projection width and the plate projection pitch in Embodiment 3 of the magnetic detector according to the present invention.
Figure 12A:
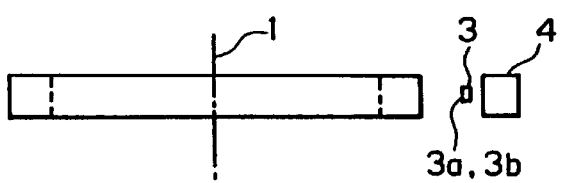
FIG. 12 shows a side view (A) and a plan view (B), respectively, showing a construction of a conventional magnetic detector.
Figure 12B:
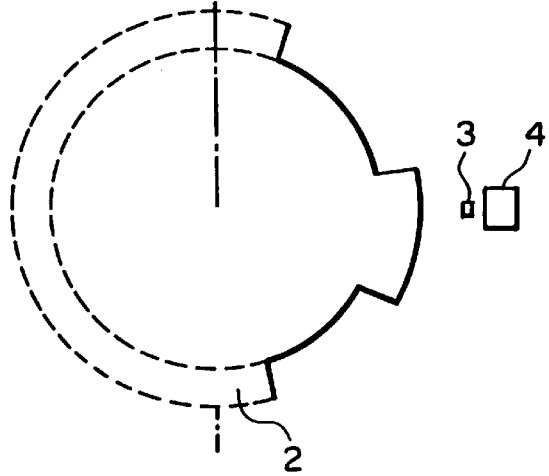
Figure 13:
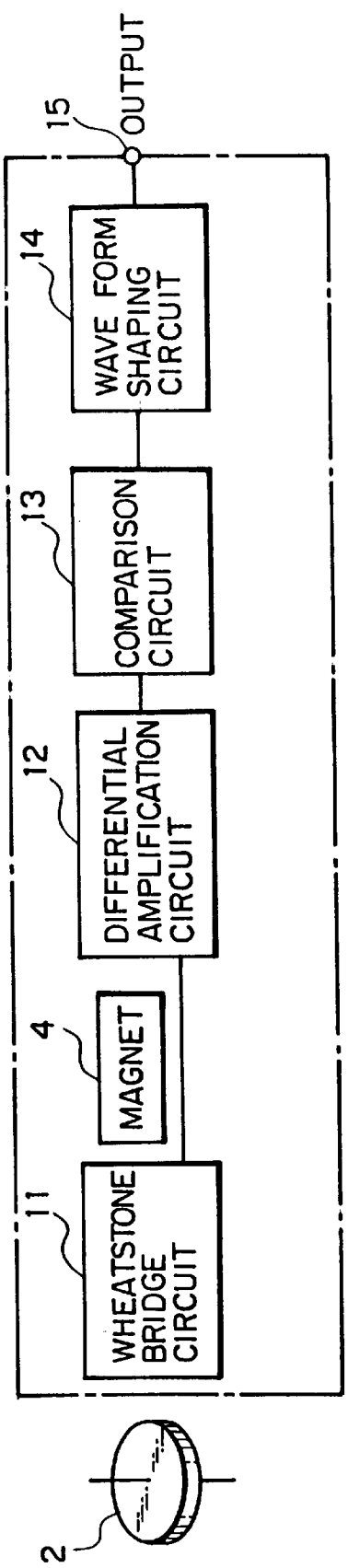
FIG. 13 is a block diagram schematically showing a circuit configuration of a conventional magnetic detector using GMR devices.
Figure 14:
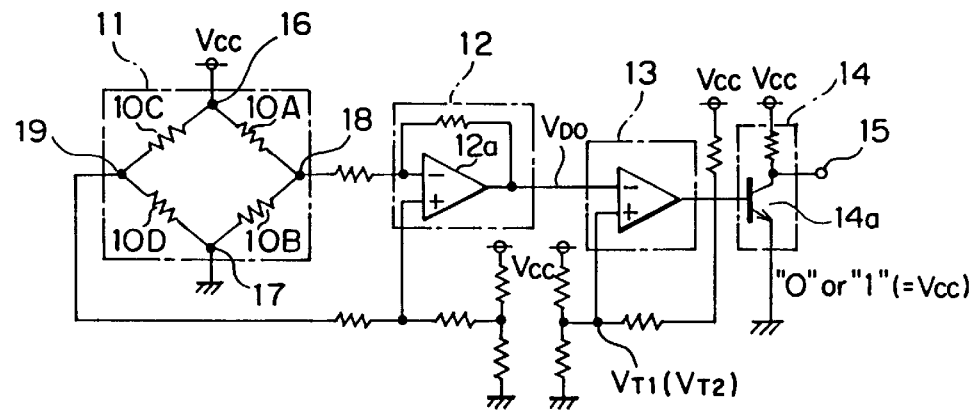
FIG. 14 is a circuit diagram showing one specific example of the circuit configuration represented by the block diagram of FIG. 13.
Figure 14:
Figure 14:
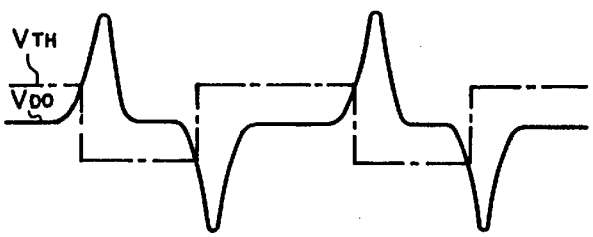
Figure 14:

Then, a graph of FIG. 11 shows the relationship among the pitch (device pitch) P between the magnetoresistance patterns 3a, 3b of the GMR device 3, the projection width M of the plate 2 and the projection pitch N of the plate 2.

From the graph of FIG. 11 and the above formula (2), the following formula holds among the size L of the magnet 4 in the rotating direction of the plate 2, the pitch P between the magnetoresistance patterns 3a, 3b of the GMR device 3, the projection width M of the plate 2 and the projection pitch N of the plate 2:

$$P = [(N-3)/4 \times \{(0.3 \times M + 0.3) \times L/7 - 0.6\} + 0.6] \pm 0.3 \, [\text{mm}] \quad (3)$$

In the case of L>7, L=7 is put in the above formula (3) because ΔR is saturated as shown in the graph of FIG. 7. Likewise, in the case of M>4, M=4 is put in the above formula (3) because ΔR is saturated as shown in the graph of FIG. 8. Also, in the case of N>7, N=7 is put in the above formula (3) because the pitch P between the magnetoresistance patterns is saturated as shown in the graph of FIG. 11, and in the case of N<3, N=3 is put in the above formula (3) because the pitch P between the magnetoresistance patterns is saturated as shown in the graph of FIG. 11.

In view of the above, the magnetoresistance patterns 3a, 3b of the GMR device 3 are arranged so as to satisfy the above formula (3) in the relationship among the length L of the magnet 4 in the rotating direction of the plate 2, the pitch P between the magnetoresistance patterns 3a, 3b of the GMR device 3, the projection width M of the plate 2 and the projection pitch N of the plate 2. As a result, changes in resistance value of the GMR device is maximally utilized and noise resistance is improved.

Thus, according to this embodiment, by arranging the magnetoresistance patterns of the GMR device so as to satisfy the above formula (3) in the relationship among the length of the magnet in the rotating direction of the plate, the pitch between the magnetoresistance patterns of the GMR device, the projection width of the plate and the projection pitch of the plate, it is possible to maximally utilize changes in resistance value of the GMR device and to improve noise resistance.

What is claimed is:

1. A magnetic detector comprising:

magnetic field generating means for generating a magnetic field, a rotary member of magnetic material arranged with a predetermined gap relative to said magnetic field generating means, and provided with projections capable of changing the magnetic field generated by said magnetic field generating means, and a giant magnetoresistance device of which resistance value is changed depending on the magnetic field changed by said rotary member of magnetic material, said giant magnetoresistance device being arranged in such a position with a predetermined gap relative to said magnetic field generating means such that said giant magnetoresistance device is subject to a bias magnetic field applied with the intensity of magnetic field in a predetermined range where said giant magnetoresistance device exhibits a higher resistance change rate than other ranges of intensity of magnetic field.

2. A magnetic detector according to claim 1, wherein magnetoresistance patterns of said giant magnetoresistance device are arranged so as to satisfy;

$$\theta = \{(L/2) + 4\} \pm 2(°)$$

on an assumption that the length of said magnetic field generating means in the rotating direction of said rotary member of magnetic material is L and the vector direction of a bias magnetic field applied to said giant magnetoresistance device is θ (the direction of a vector vertical to a magnetoresistance surface of said giant magnetoresistance device being 0°).

3. A magnetic detector according to claim 1, wherein magnetoresistance patterns of said giant magnetoresistance device are arranged so as to satisfy;

$$P = \{L \times (0.25 \times M + 0.4)/7\} \pm 0.3 \, (mm)$$

on an assumption that the pitch between the magnetoresistance patterns of said giant magnetoresistance device, constituting a bridge circuit, is P, the length of said magnetic field generating means in the rotating direction of said rotary member of magnetic material for applying a bias magnetic field to said giant magnetoresistance device is L, and the projection width of said rotary member of magnetic material is M.

4. A magnetic detector according to claim 1, wherein magnetoresistance patterns of said giant magnetoresistance device are arranged so as to satisfy;

$$P = \{(N-3)/4 \times \{(0.3 \times M + 0.3) \times L/7 - 0.6\} + 0.6\} \pm 0.3 \, (mm)$$

on an assumption that the pitch between the magnetoresistance patterns of said giant magnetoresistance device, constituting a bridge circuit, is P, the length of said magnetic field generating means in the rotating direction of said rotary member of magnetic material for applying a bias magnetic field to said giant magnetoresistance device is L, and the projection width and the projection pitch of said rotary member of magnetic material are M and N, respectively.

5. A magnetic detector according to claim 1, wherein said predetermined range of the intensity of magnetic field is 100 ±150 [Oe].

* * * * *